United States Patent [19]

Shaw et al.

[11] Patent Number: 4,874,741

[45] Date of Patent: Oct. 17, 1989

[54] NON-ENHANCED LASER EVAPORATION OF OXIDE SUPERCONDUCTORS

[75] Inventors: David T. Shaw, East Amherst; Sarath Witanachchi, Buffalo; Hoi-Sing Kwok, East Amherst, all of N.Y.

[73] Assignee: The Research Foundation of State University of New York, Albany, N.Y.

[21] Appl. No.: 181,514

[22] Filed: Apr. 14, 1988

[51] Int. Cl.$^4$ .......................... B05D 3/06; B05D 5/12
[52] U.S. Cl. .......................................... 505/1; 427/42; 427/53.1; 427/62; 427/39
[58] Field of Search ................... 427/39, 42, 53.1, 62; 505/1

[56] References Cited

PUBLICATIONS

Deposition of High Tc Superconductor Thin Films by Pulsed Laser Ablation; D. N. Mashburn et al.; Mat. Res. Soc. Symp. Proc., vol. 99.
High-Temperature Superconducting Y-Ba-Cu-O Thin Film by Using Ionized Cluster Beam Method; K. Yamanishi et al.; Mat. Res. Soc. Symp. Proc., vol. 99.
Formation and Processing of High Tc Superconductor Films with Pulsed Excimer Laser; Tomoji Kawai et al., Mat. Res. Soc. Symp. Proc., vol. 99.
Interface Effects of Laser Ablated and Sputtered High Tc Superconducting Thin Films; B. Dam et al., Mat. Res. Soc. Symp. Proc., vol. 99.
Laser Induced Deposition of $YBa_2Cu_3O_{7-x}$ Thin Films; H. S. Kwok et al., Mat. Res. Soc. Symp. Proc., vol. 99.
Superconducting Thin Films of $(RE)Ba_2Cu_3(Ag)O_{7-x}$ Prepared by Pulsed Laser Ablation; L. Lynds et al., Mat. Res. Soc. Symp. Proc., vol. 99.
Laser Deposited High Tc Superconducting Thin Films; T. Venkatesan; Solid State Technology/Dec. 1987.
Formation of Thin Superconducting Films by the Laser Processing Method; J. Narayan et al., Appl. Phys. Lett., vol. 51, No. 22, Nov. 1987.
Preparation of Y-Ba-Cu Oxide Superconductor Thin Films Using Pulsed Laser Evaporation from High Tc Bulk Material; D. Dijkkamp et al., Appl. Phys. Lett., vol. 51, No. 8,24, Aug. 1987.

Primary Examiner—Norman Morgenstern
Assistant Examiner—Margaret Bueker
Attorney, Agent, or Firm—Michael L. Dunn

[57] ABSTRACT

The present invention relates to a method of directly forming a thin, orientated layer, or film, of superconducting materials, suitably mixtures of Pervoskite-type superconducting oxides, on a support base, or substrate, by depositing the layer, or film, in an ionized oxygen atmosphere using a laser beam means. The present process is carried out at temperatures sufficiently high that the film adheres to the substrate, but sufficiently low that a superconducting layer is directly deposited the substrate. Preferably the process is carried out at a temperature less than about 450 degrees C. Temperatures as low as 400 degrees C. have been found useful.

9 Claims, No Drawings

NON-ENHANCED LASER EVAPORATION OF OXIDE SUPERCONDUCTORS

BACKGROUND OF THE INVENTION

The present application relates to electrically superconducting films and to the production of such films, and more particularly to the production of thin films of Perovskite-type superconducting oxides, commonly referred to in the art as 1-2-3 compounds.

Recently it has been found that a remarkable improvement of the critical current densities of Perovskites is obtained if epitaxial cuprate Perovskites, such as, $Y Ba_2 Cu_3 O_7$, are utilized in the form of thin, orientated films.

It is presently known that cuprate Perovskites may be prepared in the form of thin films by deposition on heated substrates, typically temperatures in the range of 400 to 800 degrees C. are employed. The deposition process is carried under vacuum and an initial thin amorphous film, desireably comprised of oxides containing the metallic elements present in a weight ratio of 1:2:3 based on the atomic mass of Y, Ba and Cu, is deposited on the substrate. Suitably the film may be deposited on the substrate by sputtering using a magnetron, or by evaporation using an excimer laser. The Perovskite materials may be supplied as separate source materials, or targets, or they may be supplied as a single composite source, or target. The structure of the initially formed film is converted into Perovskite-like structure by subsequent treatment steps. For example, the film is typically first heat treated, or annealed, over a period of time at temperatures ranging between about 700 and about 900 degrees C. and later the oxygen content and the desired structure of the heat treated film is adjusted to the desired level by a further heat treatment step, typically carried out at temperatures in the range of between about 500 to about 600 degrees C., in an oxygen atmosphere.

Various proposals have been made to combine the described processing steps. For example, it has recently been proposed to initially carry out the deposition step at a higher substrate temperature, typically from about 650 to about 750 degrees C., in an oxygen atmosphere in an attempt to adjust the oxygen content of the film during the deposition step and in this manner eliminate the intermediate heat treating step.

In any case, the high temperatures, over 500 degrees C., that are employed by the prior art processes severely limit the materials that can be utilized as substrates and cause interdiffusion of the film and the substrate surface. Usually a sharp interface, between the film and substrate or between the film and a buffer layer, is highly desirable and frequently required. The diffusion problem can not simply be solved by the use of lower processing temperatures because there is a minimum temperature, generally about 400 degrees C., that is required to insure that the film will adhere to the substrate. Further, it is known in the art that cuprate Perovskites, for example, $Y Ba_2 Cu_3 O_7$, at temperatures below about 450 C. have an orthorhombic crystalline structure and are conducive to superconductivity, while at temperatures above about 450 degrees C. such Perovskites begin to loose their superconductive properties. Thus, a high temperature treatment step must always be followed by a low temperature treatment step in order to obtain the desired orthorhombic structure.

BRIEF DESCRIPTION OF THE INVENTION

The present invention relates to a method of directly forming a thin, orientated layer, or film, of superconducting materials, suitably mixtures of Perovskite-type superconducting oxides, on a support base, or substrate, by depositing the layer, or film, under an ionized oxygen atmosphere. The present process is carried out at temperatures sufficiently high that the film adheres to the substrate, but sufficiently low that a superconducting layer is directly deposited the substrate. Preferably the process is carried out at a temperature less than about 450 degrees C. Temperatures as low as 400 degrees C. have been found useful. The thin layer, or film, is deposited on the substrate by laser beam means, suitably by the use of an excimer laser or lasers. While multiple targets, or sources of starting materials, may be utilized, preferably a single composite source, or target, is employed. Suitably the ionized oxygen atmosphere is generated by means of an electrical discharge within the treatment chamber. Discharge voltages between about 150 and about 600, and more preferably between about 250 and about 350, are aptly suited to use. Typical discharging electrode distances range between about ½ and about 3, and more preferably between about 1 to about 2 inches. Oxygen pressures of between about 0.1 and about 2.0, and more preferably between about 0.5 and about 1.0 milliTorr have been found to be eminently useful. The thickness of the deposited film may vary widely in accord with the utility of the finished product. Typically thicknesses between about 0.3 and about 1.0 microns are employed.

It is postulated that during the deposition process that the ionized oxygen atmosphere increases the surface activity of the deposited film which results in a very uniform superconductive film. The film directly deposited on a substrate is optically flat as viewed through a scanning electron microscope. The present films are found to be directly superconducting, that is, after the present deposition process, without the use of further high temperature processing conditions or the need for a separate oxygen annealing step. The present films, when deposited on a strontium titanate single crystal substrate, demonstrated an onset of superconductivity at 90 degrees K. and zero resistance at 85 degrees K. Critical current density, as .PA determined by the transport method, was found to be in the order of $10^5$ amps/cm$^2$ at 80 degrees K.

Suitable substrates for use in the present invention include both insulating and semiconductor materials, for example, sapphire, strontuim titanate, zirconia, magnesium oxide, silicon and gallium arsenide.

The present process is useful in integrating superconducting films with a variety of materials, such as, semiconductors and normal metals, which heretofore was not deemed feasible. The present process is also applicable for the in-situ fabrication of devices such as Josephson junctions and super lattice structures.

DETAILED DESCRIPTION OF THE INVENTION AND PREFERRED EMBODIMENTS

The invention will now be described in greater detail by reference to the following examples, which are to be interpreted as illustrative of, and not as limiting, the invention.

EXAMPLE I

Preparation of the Target

A composite powder mixture, comprised of finely divided 99.9995 pure $Y_2O_3$, $BaCO_3$, and $CuO$ in the atomic ratio of 1:2:3 (Y:Ba:Cu), was prepared by throughly dry mixing the components. The composite mixture was then calcined in air at 850 degrees C. for 24 hours, cooled to room temperature, and remixed. The resultant mixture was next annealed in an oxygen atmosphere at 950 degrees C. for sixteen hours, cooled to 650 degrees C. over a time period of about five hours, held at 650 degrees C. for ten hours, and then cooled to room temperature. The powder was then pressed into a one inch disc. The disc was subsequently annealed in an oxygen atmosphere at 850 degrees C. for ten hours, cooled to 650 degrees C. over a period of five hours, held at 650 degrees C. for sixteen hours, and subsequently cooled to room temperature.

EXAMPLE II

Deposition on a Substrate

A strontinum titanate substrate was prepared by treatment by separate washings in an ultrasonic cleaner with soap solution, with deionized water, with acetone, and finally with methanol.

The substrate, along with a target prepared as in Example I, were positioned within a vacuum chamber equipped with a heat and an electrical discharge source. The atmosphere within the chamber was reduced to about $5 \times 10^{-6}$ Torr pressure. The substrate was then heated to about 400 degrees C. and the chamber backfilled with oxygen to about one milliTorr ($1 \times 10^{-3}$ Torr).

An electrical discharge was created near the target using a voltage of about 300 volts. The electrode spacing was about $2\frac{1}{2}$ inches. An excimer laser was then focused on the target which was placed in rotation. The evaporated material from the target was collected on the surface of the substrate in the form of a thin uniform film. Evaporation was continued for a period of 45 minutes. The laser was then disconnected and the chamber filled with oxygen to about 100 Torr. The coated substrate was then allowed to cool to room temperature and removed from the chamber.

The electrical resistance of the film was tested and found to be zero at 85 degrees K. The critical current at 80 degrees K. was found to be about $10^5$ amp/cm2. An x-ray diffraction showed a complete orientation of the film with its C axis perpendicular to the substrate.

From the foregoing description, it will be readily appreciated by those skilled in the art that modifications may be made within the present invention without departing from the concepts disclosed. Such modifications shall be deemed to fall within the spirit of the invention as determined by the appended claims.

What is claimed is:

1. A method of depositing a superconducting layer on a substrate which comprises the steps of:
   a. forming at least one mixture of a source material for an oxide superconducting layer,
   b. evaporating said source material by a laser beam means, and
   c. depositing said source material on a substrate under an ionized oxygen atmosphere to directly form an orientated, thin superconducting layer on said substrate.

2. The method of claim 1 where in the source material is a source material for Perovskite-type oxides.

3. The method of claim 1 wherein the superconducting layer is comprised of Perovskite-type oxides.

4. The method of claim 2 wherein the said source material is a source for cuprate Perovskite-type oxides.

5. The method of claim 3 wherein the said Perovskite-type oxides are cuprate Perovskite-type oxides.

6. The method of claim 1 wherein the deposition temperature is less than about 450 degrees C.

7. The method of claim 1 wherein the ionized oxygen is obtained by the passage of an electrical discharge through an oxygen atmosphere.

8. The method of claim 7 wherein the electrical discharge ranges between about 150 and about 600 volts.

9. The method of claim 1 wherein the oxygen atmosphere ranges between about 0.1 and about 2.0 milliTorr.

* * * * *

UNITED STATES PATENT AND TRADEMARK OFFICE
CERTIFICATE OF CORRECTION

PATENT NO. : 4,874,741
DATED : October 17, 1989
INVENTOR(S) : David T. Shaw et al.

It is certified that error appears in the above-identified patent and that said Letters Patent is hereby corrected as shown below:

Cover page, please amend the title to read --ION-ENHANCED LASER EVAPORATION OF OXIDE SUPERCONDUCTORS--.

Signed and Sealed this

Ninth Day of October, 199

Attest:

HARRY F. MANBECK, JR.

Attesting Officer

Commissioner of Patents and Trademarks